United States Patent [19]

Bourdon et al.

[11] 3,847,776

[45] Nov. 12, 1974

[54] METHOD OF PREPARING A PATTERN OF A LAYER OF REFRACTORY METAL BY MASKING

[75] Inventors: Bernard Bourdon, Gometz-le-Chatel; Claudy Duong, Breuillet; Pierre Coppier, Cachan, all of France

[73] Assignee: Societe Generale de Constructions Electriques et Mecaniques (Alsthom), Paris, France

[22] Filed: Mar. 1, 1972

[21] Appl. No.: 230,929

[30] Foreign Application Priority Data

Mar. 5, 1971 France .............................. 71.07862
Dec. 6, 1971 France .............................. 71.43790

[52] U.S. Cl. .............................................. 204/192
[51] Int. Cl. .............................................. C23c 15/00
[58] Field of Search .................................... 204/192

[56] References Cited

UNITED STATES PATENTS

| | | | |
|---|---|---|---|
| 3,516,914 | 6/1970 | Hall | 204/192 |
| 3,474,021 | 10/1969 | Davidse et al. | 204/192 |
| 3,436,327 | 4/1969 | Shockley | 204/192 |
| 3,410,774 | 11/1968 | Barson et al. | 204/192 |

*Primary Examiner*—John H. Mack
*Assistant Examiner*—D. R. Valentine
*Attorney, Agent, or Firm*—Flynn & Frishauf

[57] ABSTRACT

A layer of refractory metal for example of tungsten or molybdenum, and about one micron thick is prepared in accordance with a predetermined pattern by masking by applying the refractory metal on a substrate which may be conductive or is close to a conductor; the refractory metal is covered by a protective layer, in the mask pattern. The protective layer may, in turn, have been covered with a photoresist and have been partly etched away. The masked, continuous layer of refractory metal is exposed to an electro-erosive environment which selectively attacks only the refractory metal but does not attack the protective masking layer, and the exposed refractory metal layer is removed; the masking layer is then dissolved in a substance which is inert with respect to the refractory metal. The refractory metal may be removed by placing the metal in an ionized gaseous medium or by electrolytic compositions. A suitable protective layer is silicon nitride.

15 Claims, 4 Drawing Figures

METHOD OF PREPARING A PATTERN OF A LAYER OF REFRACTORY METAL BY MASKING

The present invention relates to a process of preparing a pattern of a layer of refractory metal on a substrate, and more particularly to a process of masking refractory metals such as tungsten or molybdenum which are applied to a conductive, or semiconductor carrier.

In the manufacture of semi conductors or integrated circuits, masking techniques have long been used. Such masks utilize a photo sensitive resin from which certain parts are removed after exposure to a light pattern. The underlying material thus laid bare is then subjected to chemical attack. This method which is widely utilized does not pose particular problems if the material which is protected is rapidly attacked by the chemical agents, which is, for example, the case with silicon oxide. If, however, the material which has been laid bare and which is to be removed can be etched off chemically only after prolonged attack, the resins which are to protect the material which is to remain usually no longer are satisfactory since they, themselves, cannot resist extended attack of acid or alkaline etches. This is particularly true when refractory metals are utilized as metallic covers on a substrate, for example semiconductor grade silicon. Refractory metals which are used in such processes are, typically, tungsten or molybdenum.

It is, accordingly, an object of the present invention to provide a process which permits masking and removal of non-protected metal which is accurate and sharp, and which does not subject the protective cover layer to attack by the agent removing the refractory metal.

SUBJECT MATTER OF THE PRESENT INVENTION

Briefly, the refractory metal is deposited as a continuous layer on a substrate, which may be a conductor, a semiconductor, or even a non-conductor. It is covered with a protective layer, the protective layer being photo-engraved by conventional means to provide a mask which is to be reproduced. The protective layer itself is of a material which is not attacked when the refractory material is removed but may be dissolved by a solution which is inert with respect to the refractory metal. The removal step itself is not chemical, that is by an acid or alkaline bath, but rather electrolytically or by ion bombardment in a gaseous medium. A suitable protective material is a silicon-nitrogen compound such as silicon nitride.

In accordance with a feature of the invention, a continuous layer of protective material is provided over the layer of refractory metal, such as tungsten or molybdenum, and the protective material itself is etched away by photo engraving, to make a mask, the laid bare material by removal of the protective layer then being attacked electrolytically or by electro-erosive action, for example in an ionized gas surrounding. To be attacked by ionization, the material is polarized negatively with respect to the ionized gas.

The invention will be described by way of example with reference to the accompanying drawings, wherein.

Figure 4:
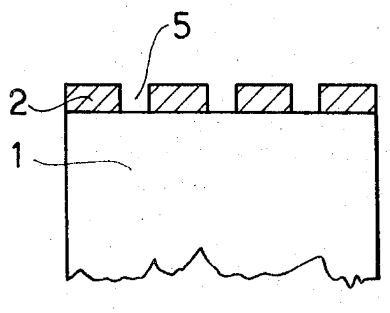

and FIG. 4 is a cross-sectional view of the finished semi conductor substrate with a patterned layer of refractory metal, in accordance with a mask.

A semi conductor body 1, such as silicon for example, forms the substrate. This body may be pure semiconductor grade silicon or it may already have one or more semi conductor junctions formed therein, by methods known in the art and not forming part of the present invention. A continuous layer 2 of refractory material such as tungsten, for example, is applied over the semiconductor. The continuous layer 2 is, in turn, covered by a further continuous layer of a protective material, such as a silicone-nitrogen compound, for example silicon nitride. It, in turn, is covered by a mask 4 of photo-sensitive resin. The photosensitive mask 4 is applied in known fashion and leaves, after exposure, certain non-protected regions 5. The thickness of the tungsten layer 2 is in the order of 1 micron, for example, although it may vary widely. The thickness of the protective layer 3 of silicon nitride is in the order of 1,000 A. The tungsten may be deposited for example from decomposition in vapor phase, by cathodic sputtering, or other well known methods.

Figure 2:
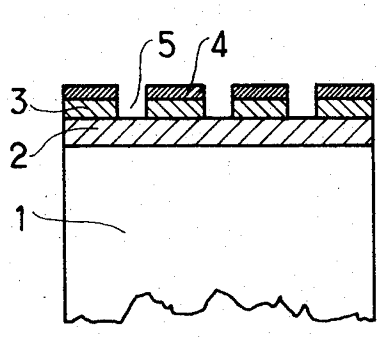
FIG. 2 is a cross-sectional view of the element of FIG. 1 after the protective cover has been attacked.

The substrate with the continuous layer of refractory metal and the continuous layer of protective material 3 is then subjected to chemical attack in a solution containing, for example, hydrofluoric acid. The silicon nitride is attacked at the areas 5 where it is not protected by photosensitive resin 4, thus exposing the underlying layer of tungsten 2. FIG. 2 illustrates a cross section of the device after this step, that is, after chemical etching of the protective layer 3.

Figure 3:
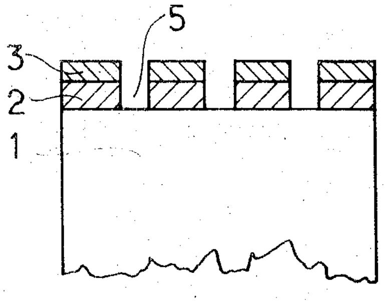
FIG. 3 is a cross-sectional view after electrolytic or ion bombardment attack of the refractory metal.

The next step is that of the removal of the tungsten layer, as shown in FIG. 3. The protective layer 3 of silicon nitride forms a mask for the tungsten layer 2. The process to remove the tungsten is so selected that the nitrogen compound layer is not attacked. Thus, the body is subjected to electrolytic attack which removes the tungsten from the regions 5, where the silicon body 1 is exposed. Thanks to effects of polarization phenomena, it is possible to carry out this electrolytic attack even if the refractory metal is deposited on a dielectric, that is on an insulator, provided the insulator is thin and provided further that the whole is carried on a conductive support.

Figure 1:
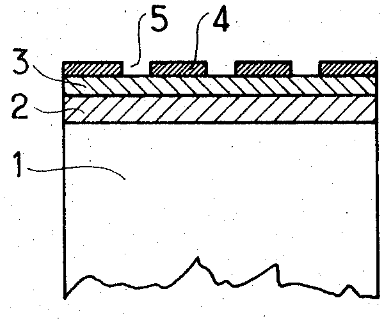
FIG. 1 illustrates a semi conductor substrate with a photosensitive mask before any chemical attack.

Other than electrolytic methods can be used to remove the refractory metal. The refractory metal may be attacked ionically. The same preparatory steps as previously described are first carried out, that is, the steps of FIGS. 1 and 2. Thereafter, the refractory metal is removed by ionic attack, by placing the entire device in an airtight vessel which is evacuated and thereafter filled with a gas, preferably of the family of noble gases, such as argon. The devices are placed on a metallic or otherwise conductive support which is insulated from the remainder of the vessel. The device is connected to a negative terminal of a d-c source. The positive terminal is connected to the vessel, or to a metallic part which is in contact with the gas within the vessel, to form an anode. In this method, the substrate may be a semi conductor body of silicon covered with tungsten, and itself covered and masked in those places where the tungsten is not to be removed, by silicon nitride.

When the device is placed on the metallic conductive support, the tungsten will be at the voltage of the support.

A direct voltage is then established between the gas and the metallic support of such intensity that the gas will ionize, and ions will impinge on the tungsten within the zones, or windows where the silicon nitride, that is the protective layer, is absent. Secondary emission of tungsten will result under the impact of the ions impinging thereagainst; the secondary emission maintains the ionization of the gas. The silicon nitride is likewise bombarded by argon ions but, since this material is an insulator it will rapidly receive a positive charge under the effect of the ion bombardment and will then be protected against the bombardment due to mutual repulsion, particularly when it has reached a voltage which is positive with respect to the refractory material therebeneath. The silicon nitride thus is practically immune from attack by ion bombardment, so that the tungsten removal is carried out with sharp definition at the edges of the masks. These edges are not attacked by the ion bombardment. Since the protective layer of silicon nitride is not attacked by the ionic bombardment, its thickness, or thinness is of little consequence with respect to the protection provided thereby and it can, therefore, be extremely thin regardless of the thickness of the layer of tungsten. It is only necessary that the silicon nitride layer has sufficient thickness to prevent flash-over, that is, sufficient thickness to provide insulation to the voltage which will be established between the free surfaces and those in contact with the tungsten. The voltage of the direct current source is preferably controllable from several tens to several hundreds of volts, such that the level thereof can be controlled with respect to the type of article subjected to ionic bombardment. In other words, the voltage should be controlled as a function of the refractory material to be removed, its thickness, the width of the windows, or removal path and the like.

Ionic bombardment can also be obtained by means of a gas plasma, for example argon gas plasma, by using an emissive cathode and an anode. The device, from which the refractory metal is to be removed, in the example tungsten, is then placed at a voltage which is negative with respect to the cathode. The voltage preferably is controllable, to control the speed of the ions which bombard the tungsten. An extraction of ions from plasma will result which, in this instance, will exist independently of secondary emission of the tungsten into the argon. The silicon nitride cover layer is not subjected to ion bombardment for the same reason as those above referred to.

Ionization of the gas can be carried out by other means than an emissive cathode. Thus, similar to the system in which the device is placed in an evacuated vessel, having argon gas therein, the argon can be ionized by a source of radiation, such as ultra-violet (UV) radiation, a radioactive source, or the like.

FIG. 4 illustrates the finished semiconductor. The silicon nitride is removed by an acid solvent, for example hydrofluoric acid.

The photosensitive resin which had initially permitted the attack on the silicon nitride (compare FIGS. 1 and 2) is removed during electrolytic attack; if the refractory metal is removed ionically then the resin should preferably be dissolved before the silicon nitride itself is to be eliminated. Any suitable well known solvent for photo-sensitive resins can be used. This is a step well known in the art and need not be described in detail. Electrolytic attack and ion bombardment may collectively be referred to for the purposes of the present invention as electro-erosion.

The present invention has been described in detail with respect to a silicon semiconductor substrate, on which a layer of tungsten is applied, protected by a layer of silicon nitride. The invention is not limited to semiconductor substrates, nor to the materials referred to, which have been given only by way of example to illustrate the method of masking and electro-erosive removal by electrolytic, or ion bombardment to attack the refractory metal. Other equivalent and similar materials may be used with other refractory materials.

Suitable materials for the protective layer, in addition to the silicon-nitrogen compounds, are silica and alumina. Another refractory metal than molybdenum and tungsten with which the invention can be used is tantalum. With tantalum, a protective layer of tantalum pentoxide $Ta_2O_5$ is particularly suitable.

We claim:

1. A method of preparing a pattern of a layer of refractory metal on a substrate by masking, comprising:

applying the refractory metal on the substrate as a continuous layer;

covering the continuous layer of refractory material with a continuous protective layer of a material substantially more resistant to ion bombardment than said refractory metal;

photolithographically applying a mask on said protective layer corresponding to said pattern;

chemically etching said protective layer with an etchant to which said refractory metal is resistant, to expose said refractory metal in selected areas;

exposing said refractory metal and said protective layer to ion bombardment in an ionized gaseous medium to remove said refractory metal in said selected areas, and dissolving the remainder of said protective layer with a reagent which is inert with respect to the underlying refractory metal.

2. A method according to claim 1 in which said gaseous medium is ionized by an applied electric field in which said substrate is at relative electro-negative potential, and in which said electric field is of sufficient strength to produce enough secondary emission from the refractory metal to maintain the ionization of the gas during the ion bombardment step.

3. A method according to claim 1 in which said gaseous medium is ionized by electron emission from an electron emissive cathode electronegatively polarized relative to an electron collecting anode, said gaseous medium, cathode and anode being in a space sufficiently evacuated for such electron emission and gas ionization, and in which, further, said refractory metal is negatively polarized by means of a controllable d.c. voltage source providing a voltage between the refractory metal and said electron emissive cathode.

4. A method according to claim 1 in which said gaseous medium is ionized by an ultraviolet light source and is subjected to an electric field with respect to which said refractory metal is electronegatively polarized, so as to attract positive ions.

5. A method according to claim 1 in which said gaseous medium is ionized by a radioactive radiation source and is subjected to an electric field with respect to which said refractory metal is electronegatively polarized, so as to attract positive ions.

6. Method according to claim 1, wherein the refractory metal is tungsten or molybdenum, and the protective layer is silicon nitride.

7. Method according to claim 1, wherein the protective layer is an insulating material selected from the group consisting of insulating oxides and insulating nitrides.

8. Method according to claim 1, wherein the step of removal of the refractory metal in the non-protected locations includes electrolytic attack.

9. Method according to claim 1, wherein the gaseous medium comprises at least one noble gas.

10. Method according to claim 1, wherein the gaseous medium comprises a mixture of gases of which at least one is a noble gas.

11. Method according to claim 1, wherein the step of removing the refractory metal comprises locating the substrate, the metal thereon and the protective layer in an electrically conductive environment and applying a voltage to the metal with respect to the environment of such polarity as to provide for removal of said metal due to said voltage.

12. Method according to claim 11, wherein the protective layer is an insulator and its thickness is just enough to insulate, without breakdown, the refractory metal therebeneath with respect to said voltage against the conductive environment.

13. Method according to claim 1, wherein the substrate is a semiconductor body.

14. Method according to claim 1, wherein the refractory metal layer has a thickness in the order of 1 micron.

15. Method according to claim 1, wherein the protective layer is an insulator of a thickness of about 1,000 A.

* * * * *